United States Patent [19]

Emery et al.

[11] 4,446,426

[45] May 1, 1984

[54] ON-LINE RF ARC MONITOR FOR LARGE ROTATING GENERATORS

[75] Inventors: Franklin T. Emery, Greentree, Pa.; Bruce N. Lenderking, Glen Burnie, Md.; Robert D. Couch, New Freedom, Pa.

[73] Assignee: Westinghouse Electric Corp., Pittsburgh, Pa.

[21] Appl. No.: 318,225

[22] Filed: Nov. 4, 1981

[51] Int. Cl.³ .................... G01R 31/06; G01R 31/02
[52] U.S. Cl. ............................ 324/158 MG; 324/51; 324/102; 361/31
[58] Field of Search ................ 324/51, 102, 158 MG; 361/31

[56] References Cited

U.S. PATENT DOCUMENTS 3,775,675 11/1973 Freeze et al. .................. 324/102
4,156,846 5/1979 Harold et al. ............. 324/158 MG
4,356,443 10/1982 Emery ..................... 324/158 MG

OTHER PUBLICATIONS

"Turbine-Generator On-Line Diagnostics Using RF Monitoring" by F. T. Emery et al., Paper No. 81SM503-2, IEEE PES Summer meeting, Portland, Ore. Jul. 26-31, 1981.

Primary Examiner—Stewart J. Levy
Attorney, Agent, or Firm—M. P. Lynch

[57] ABSTRACT

The level and duration of RF current flowing in the neutral grounding circuit of a generator is monitored to determine internal arcing conditions.

9 Claims, 8 Drawing Figures

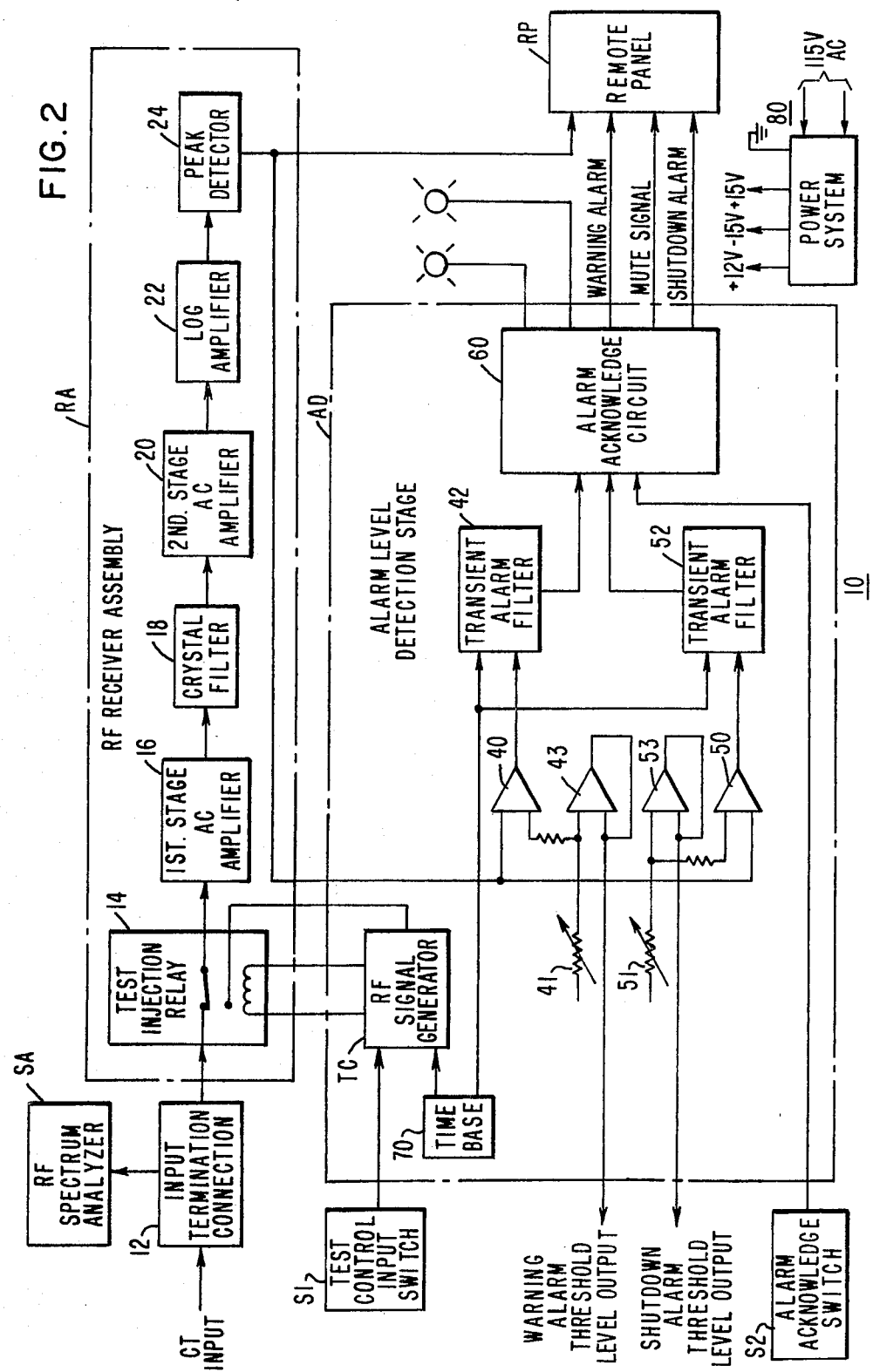

ON-LINE RF ARC MONITOR FOR LARGE ROTATING GENERATORS

BACKGROUND OF THE INVENTION

Arcing in a generator can lead to extensive damage which in turn can result in long-term costly outage. Internal generator arcing can be caused by insulation failure, copper fatigue failure or voltage breakdown due to reduced clearances between components operating at different voltages. These potentially damaging arcs result in short duration current pulses containing radio frequency signal components which flow in the generator's neutral grounding circuit. An internal arcing condition in a generator results in a higher than normal level of neutral RF current and there is disclosed herein a novel technique utilizing the measurement of the generator's RF neutral current to detect arcing in a generator.

The use of a spectrum analyzer to measure high frequency currents flowing in the neutral lead of a generator to monitor arcing conditions is described in U.S. Pat. No. 4,156,846, issued May 29, 1979, assigned to the assignee of the present invention and incorporated herein by reference.

SUMMARY OF THE INVENTION

There is disclosed herein with reference to the accompanying drawing apparatus for detecting internal arcing conditions in a generator through the use of an on-line monitoring apparataus which is responsive to the generator's neutral RF current. A high frequency current transformer is connected to the generator's neutral grounding lead. The output of the current transformer is coupled as an input to an RF monitoring apparatus including a highly sensitive radio frequency measuring circuit. If the magnitude of the RF component exceeds a predetermined level for a predetermined duration indicative of an internal arcing condition then visual and audible alarms are activated.

The arc conditions developed are not continuous but are regularly interrupted and re-ignited, due to the movement of the surfaces between which the arcing occurs and also due to the cyclic nature of the arc voltage, i.e., 60 hertz. In most situations, the arc is re-ignited each time the voltage exceeds the breakdown strength of the gap between the arcing surfaces. The arcs cause short-duration current pulses, containing radio frequency signal components, which flow in the generator's neutral grounding circuit.

A current transformer that has a frequency response from 30 hertz to 30 megahertz is used to measure the radio frequency current flow in the generator's neutral lead. The neutral lead is chosed as a good measurement location because it is at a low potential with respect to ground and also because arcing at any location in the generator causes RF current flow in the neutral lead.

BRIEF DESCRIPTION OF THE DRAWING

The invention will become more readily apparent from the following exemplary description in connection with the accompanying drawing:

FIG. 2 is a block diagram schematic illustration of an implementation of the novel arc monitoring apparatus of FIG. 1;

DESCRIPTION OF THE PREFERRED EMBODIMENT

Figure 1:
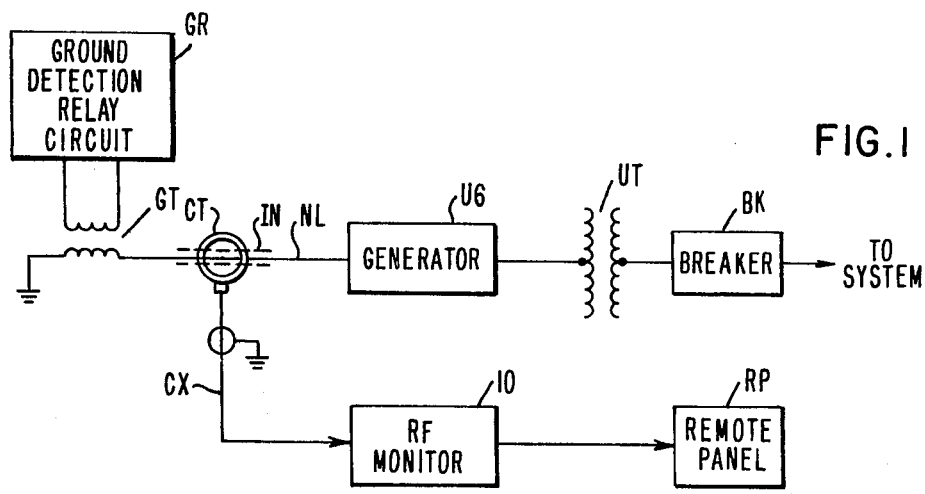
FIG. 1 is a block diagram schematic illustration of the connection of the novel RF monitoring circuit connected between a generator neutral and a neutral grounding transformer.

Referring to FIG. 1 there is illustrated an electrical system including a unit generator UG having a neutral grounding lead NL connected to a neutral grounding transformer GT. A ground detection relay circuit GR is connected to the neutral grounding transformer GT. The output of the unit generator UG is coupled via a unit transformer UT and a breaker circuit BK to an electrical load (not shown).

Figure 7:
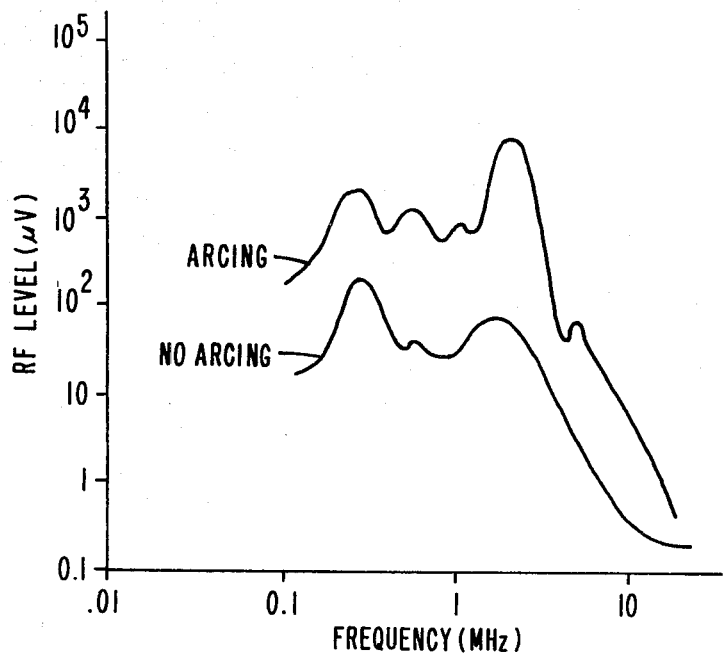
FIG. 7 is a graphical illustration of RF level versus frequency comparing the RF spectra for an arcing and no-arcing condition.

A high frequency current transformer CT having an outer case at ground potential is positioned about the insulation IN of the neutral grounding lead NL. The current transformer CT is connected to an RF monitor circuit 10 via a length of coaxial cable CX having its outer conductor at ground potential. The RF monitor circuit 10 measures the magnitude and duration of the RF component of the current flowing in the neutral grounding lead NL and provides both a local alarm response in the event of RF conditions indicative of internal generator arcing, and a remote alarm indication to remote control room recorders and displays RP. The high frequency current transformer CT is a split, high frequency current transformer, such as the commercially available Stoddart 50 ohm impedance, inserted primary type having a frequency range from 30 hertz to 30 megahertz. The RF spectra for arcing and no-arcing conditons in a generator are illustrated in FIG. 7.

The RF monitor circuit 10, as typically implemented in FIG. 2, provides two levels of annunciation of internal arcing conditions in the generator UG. The first level is a warning level indicating that a change in RF activity has occurred. This level is typically preset in the RF monitor apparatus 10 to correspond to an RF magnitude which will provide a warning indication to an operator and allow for an operator assessment and response. The second level of annunciation is a shutdown level corresponding to an RF magnitude indicative of severe internal arcing. The alarm thresholds can be adjusted to warn of any further increase in the RF activity, in the event the operator determines that the generator UG can stay on-line, at normal or reduced power, until a scheduled shutdown is permitted. A permanent record of the operational history can be maintained on a chart recorder included with the remote control room circuitry RP.

Referring to FIG. 2, an input termination connection 12 of appropriate impedance, i.e., 50 ohms in the event the above-identified commercially available transformer is employed, accepts the current signal of the current transformer CT and supplies it as an input signal to the RF monitoring apparatus 10 via a test injection relay 14. The current transformer signal is also made available to an RF spectrum analyzer SA. The test injection relay 14 enables the operator to manually disconnect the current transformer input signal from the RF monitoring apparatus 10 via the operator switch S1 and inject a predetermined RF test signal developed by an RF signal generator test circuit TC. Under normal operating conditions however the test circuit TC is disconnected from the RF monitoring apparatus 10 and the test injection relay 14 supplies the signal developed by the current transformer CT to the circuit components of the receiver assembly RA.

The RF receiver assembly RA includes four major components: an AC amplifier, a crystal filter, a log amplifier, and a peak detector. Th AC amplifier is divided into two stages, a first amplifier stage 16 and a second amplifier stage 20. The first amplifier stage 16 is positioned before the crystal filter 18 while the second amplifier stage 20 is positioned after the crystal filter 18. The first amplifier stage 16 functions to provide current transformer signal gain and to match the input impedance of the crystal filter 18. The second amplifier stage 20 provides the required band limiting to reduce the effects of out-of-band signals, i.e., amplifier noise and low voltage power supply transients, and to provide further signal gain. The amplifier stages 16 and 20 combine to give the current transformer signal the proper amplitude for log amplifier processing in a sevenstage log amplifier 22.

The crystal filter 18 is the primary band limiting element in the RF receiver assembly RA. The critical characteristics of the filter 18 are bandwidth and shape factor. In the typical embodiment referred to herein the values indicated correspond to the signal characteristics of the instrumentation that was used to obtain experimental field data. In the disclosed embodiment the appropriate characteristics of the crystal filter 18 are such that the 3-dB bandwidth is approximately 5 kilohertz ±10% and the shape factor is identified as a 4-pole Chebyshev response. The center frequency $F_O$ of the bandpass crystal filter 18 is one megahertz. It has been determined experimentally that this center frequency is particularly suitable for continuous monitoring of RF activity in large generators. The level of background RF current is relatively independent of generator load. This is true whether the generator use brush type or brushless excitation. Inasmuch as the one megahertz center frequency is in the broadcast band, appropriate shielding is required.

Figure 3A:
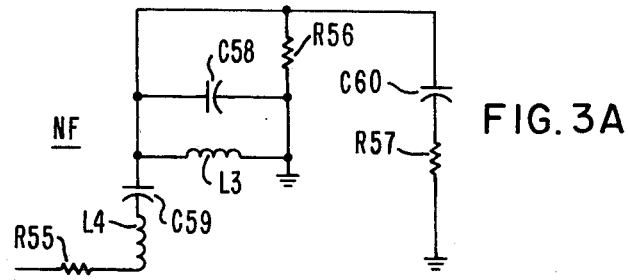
FIG. 3A is a schematic illustration of an out-of-band noise filter used in FIG. 1.
Figure 3B:
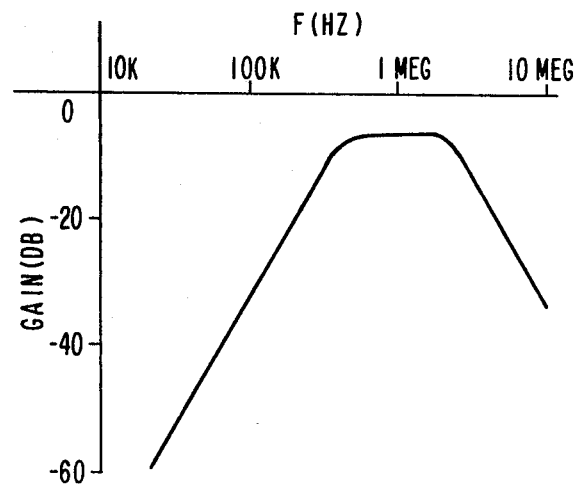
FIG. 3B is a graphical illustration of the operation of the filter of FIG. 3A.

The out-of-band filtering is provided by two, two pole filters, such as schematically illustrated in FIG. 3A, which reduce the probabability that a signal is out of the frequency selected band causing a false upscale reading. The out of band noise filter NF of FIG. 3A includes resistor R55 as the source impedance and the parallel combination of resistors R56 and R57 as the load impedance. The arrangement of resistors R55, R56 and R57, inductors L3 and L4 and capacitors C58 and C59 form a 2-pole bandpass filter. The filter has a center frequency of 1 megahertz with $F_u = 2 \times 10^6$ Hz and $F_L = 5 \times 10^5$ Hz. The performance of filter NF is graphically illustrated in FIG. 3B.

The log amplifier 22 consists of seven cascaded stages of equal gain to form a total gain of 3160. In each of the seven stages there is a limiting amplifier having an output connected to the next amplifier stage and a Cooke-Yarborough circuit. The outputs of the seven Cooke-Yarborough circuits are summed at a temperature compensated scaling and offset amplifier. The output of the log amplifier 22 corresponds to the output of the temperature-compensated scaling and offset amplifier. This output signal is supplied to a peak detector circuit 24 which provides a peak detection of the log amplifier output signal within approximately a one millisecond charge time and a 600 millisecond discharge time.

Figure 4:
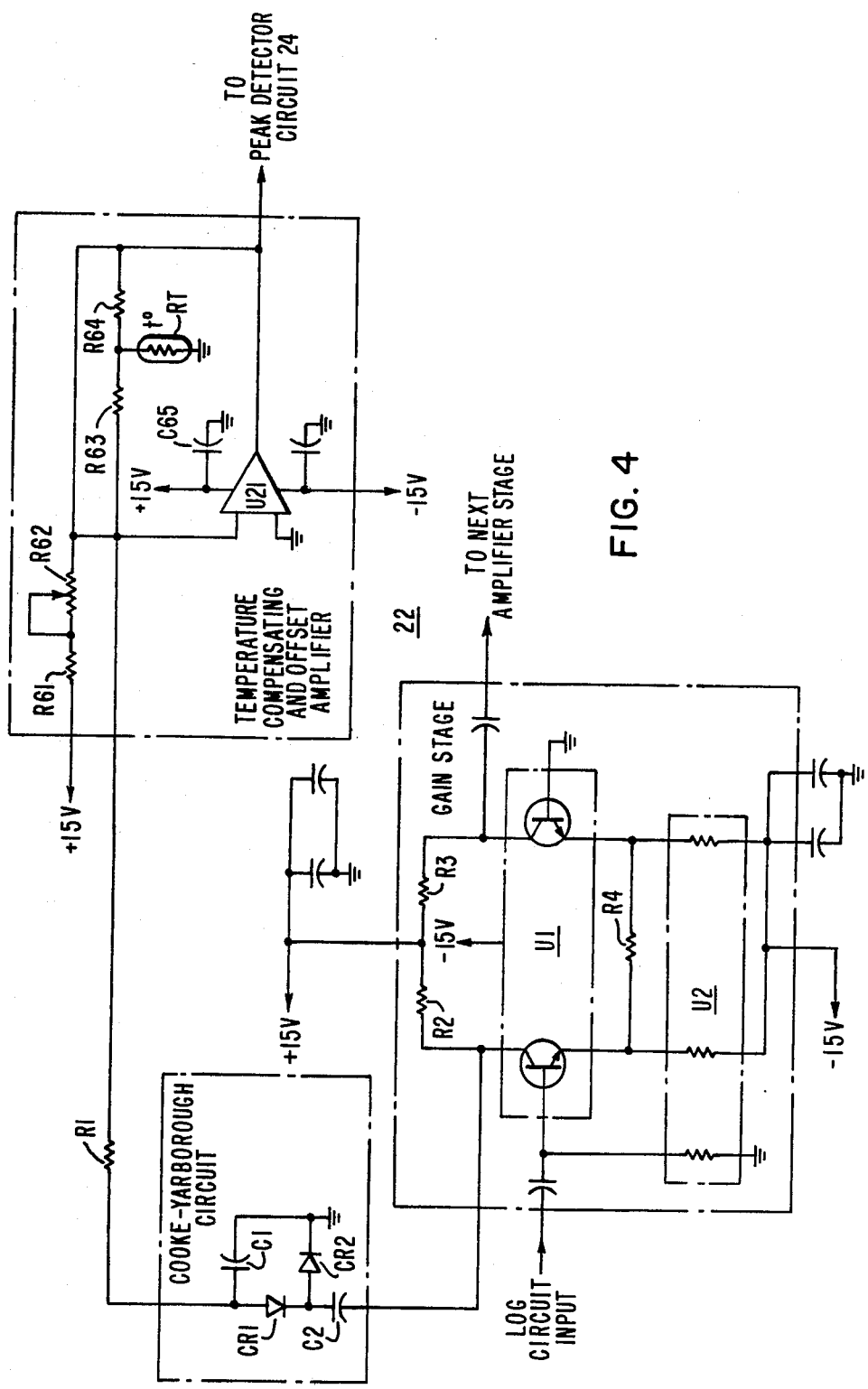
FIG. 4 is a schematic illustration of an implementation of the log amplifier circuit of FIG. 2.

A detailed schematic illustration of one of the seven identical log amplifier stages in combination with the common temperature compensating and offset amplifier circuit is illustrated in FIG. 4. Components U1, U2, R2, R3, and R4 form one of seven identical gain stages that are included in the log amplifier 20. The gain for each stage is set by resistors R2, R3, and R4. Resistor combination R2/R4 is the approximate gain to the Cooke-Yarborough circuit and resistor combination R3/R4 is the approximate gain to the next amplifier stage. The Cooke-Yarborough circuit comprised of capacitors C1 and C2, and rectifiers CR1 and CR2 converts the A.C. amplifier output signal to a D.C. signal that is summed with the outputs of the other six amplifier stages. Resistor R1 is the summing resistor which connects the Cooke-Yarborough circuit to the summing amplifier U21. Offset correction is provided by resistors R61 and R62. Gain and temperature compensation is provided by resistors R1, R73, R64, R65 in combination with a temperature responsive resistor RT.

Figure 5:
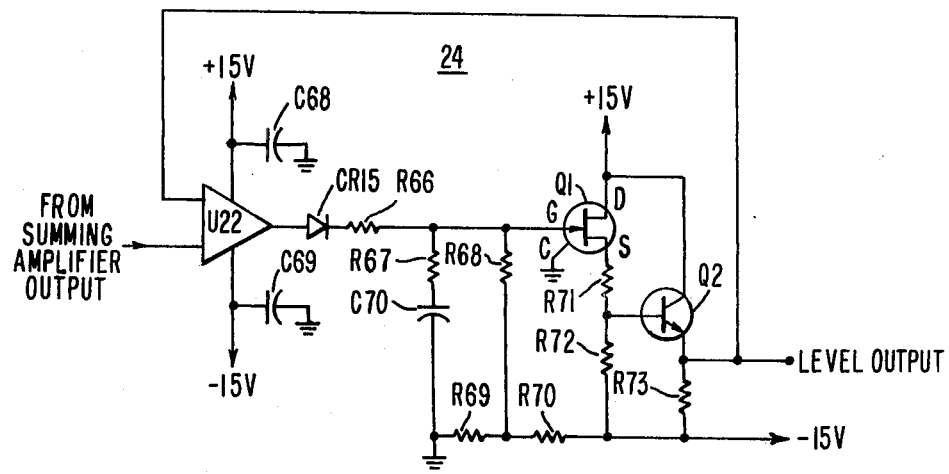
FIG. 5 is a schematic illustration of an implementation of the peak detector circuit FIG. 2.

An implementation of the peak detector circuit 24 is schematically illustrated in FIG. 5. Amplifier U22 is connected as a voltage follower whose output will vary according to the time constants set by resistors R66, R67, and capacitor C70, charging; resistors R67, R68, and capacitor C70, discharging. The peak detection is performed by rectifier CR15. As long as the input to the amplifier U22 is increasing the level output will increase at the charging rate. If, however, the input signal to the amplifier U22 begins to decrease the rectifier CR15 becomes reversed biased and the level output decreases at the discharging rate. The field effect transistor Q1 serves as a high impedance buffer so that the output discharging time constant will not be degraded by loading conditions. The transistor Q2 acts as an emitter follower to provide current drive capability.

The output of the peak detector circuit 24 of the RF receiver assembly RA is supplied both to the remote control room circuitry RP for direct monitoring and also as an input signal to the alarm level detection stage AD of the RF monitoring apparatus 10.

The alarm level detection stage AD includes alarm level comparator circuits 40 and 50, transient alarm filters 42 and 52, an alarm and acknowledge logic circuit 60 and a system time base generator 70. The alarm level comparator circuit 40 is designated the warning alarm level comparator and operates by comparing the output signal from the peak detector circuit 24 to a warning alarm threshold level established by an adjustable potentiometer 41. The warning threshold alarm level established by the potentiometer 41 is also supplied as an input to the operation amplifier 43 which in turn makes the threshold alarm level signal available as an output signal for display purposes in the remote control room circuitry RP. The alarm level comparator circuit 50 functions as a shutdown alarm level comparator by comparing the output of the peak detector circuit 24 to a shutdown alarm threshold level input developed by the adjustable potentiometer 51. The shutdown alarm threshold level is also supplied as an input signal to the operational amplifier 53 which provides the shutdown alarm level signal to the remote control room display circuitry RP. In the event the output signal of the peak detector circuit 24 exceeds the warning threshold level input to the comparator circuit 40, the comparator circuit 40 transmits an output signal to the transient alarm filter circuit 42. Similarly, if the output signal of the peak detector circuit 24 exceeds the shutdown alarm threshold level input of the comparator circuit 50, the comparator circuit 50 transmits an output signal to the transient alarm filter circuit 52.

The transient alarm filter circuits 42 and 52 basically consist of a combination of counter circuits and clock circuits responsive to the system time base generator 70. The transient alarm filter circuits 42 and 52 protect against false alarms due to transient variations in the RF level. The transient alarm filter circuits 42 and 52 represent variable delay circuits which are preset to a desired delay time which requires the presence of an output signal from the corresponding comparator circuit for a time exceeding the programmed delay time before the comparator output signal is acknowledged as a valid RF alarm condition. When the duration of the output signal from the comparator circuit 40 exceeds the programmed delay of the transient alarm filter circuit 42, an output signal from the transient alarm filter circuit 42 acknowledging the validity of the RF signal is communicated to the alarm and acknowledge logic circuit 60 which responds by activating a warning threshold level annunciation sequence. This annunciation can take the form of visual or audio displays in the remote control room circuitry RP. Similarly the transient alarm filter circuit 52 responds to the presence of an output signal from the comparator circuit 50 of a duration exceeding the programmed delay of the filter circuit 50 by transmitting a signal to the alarm and annunciator logic circuit 60 acknowledging the presence of an RF signal exceeding the shutdown alarm threshold level. The alarm and acknowledge logic circuit 60 will respond to the output signal from the transient alarm filter circuit 52 by initiation annunciation of the shutdown threshold level condition in the remote control room circuitry RP. A remote alarm acknowledge switch S2 enables the operator to communicate an acknowledgement of the alarm condition to the alarm and acknowledge logic circuit 60.

Figure 6:
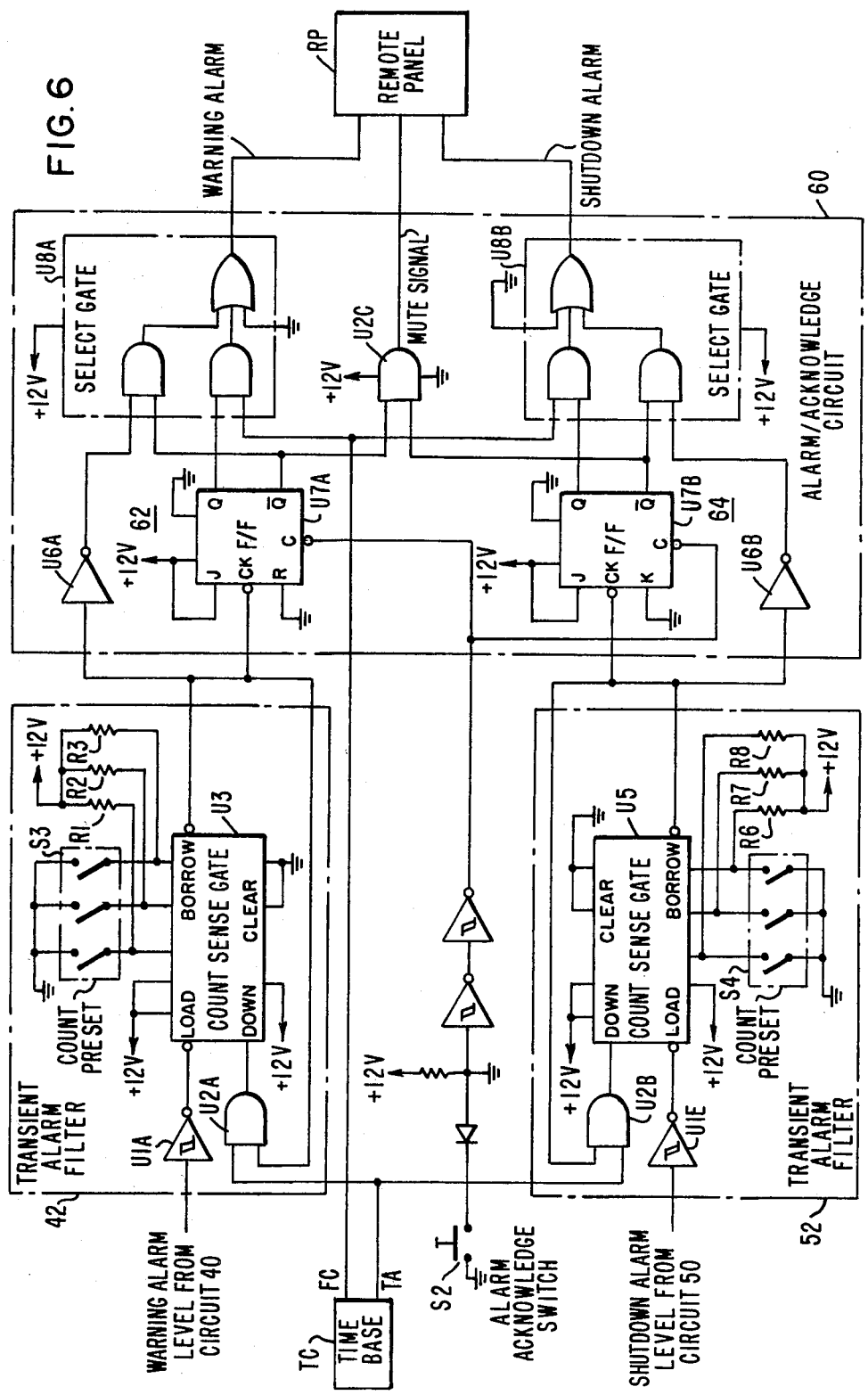
FIG. 6 is a schematic illustration of an implementation of the alarm comparator and initiation functions of FIG. 2.

Referring to FIG. 6 there is schematically illustrated an implementation of the transient alarm filter circuits 42 and 52, and the alarm acknowledge circuit 60. The transient arm filter circuits 42 and 52 include presettable down counters U3 and U5 which are commercially available as circuit types 74C193. The warning alarm level transient filter circuit 42 further includes a count preset programmable switch S3, pull-up resistors R1, R2 R3, a count sense gate U2A (commercial circuit 74C08) and a level inverter circuit U1A (commercial circuit 74C914). Similarly, the shutdown alarm level transient filter circuit 52 includes a count preset programmable switch S4, pull-up resistors R6, R7 and R8, a count sense gate U2B and a level inverter circuit U1E. Inasmuch as the operation of each of the alarm filter circuits in response to level inputs from circuits 40 and 50 respectively is identical, the following description of the operation of transient alarm filter circuit 42 will likewise apply to the operation of the transient alarm filter circuit 52. An alarm level input signal from the warning alarm level comparator circuit 40 indicative of an input signal to the comparator exceeding the alarm threshold set by circuit 41 results in a level change which loads the presettable down counter U3 with a present count (N) established by the programmable switch 53. A clock signal TA from the time base circuit TC is gated through the count sense gate circuit U2A by the borrow signal from the presettable down counter U3. After "N" clock signals have been gated through the count sense gate U2A to the presettable down counter U3 the borrow signal of the presettable down counter U3 changes and the count sense gate U2A is disabled thus preventing further clock signals from activating the presettable down counter U3. In the event the level change produced by the signal received from the comparator circuit 40 is of a duration less than "N" clock signals TA a new preset count would be initiated and the borrow signal from the presettable down counter U3 would not change. A change in the borrow signal of the presettable down counter U3 signifies that a true alarm condition exists and this change in borrow signal is transmitted as an input signal to the alarm/acknowledge circuit 60. The alarm/acknowledge circuit 60 consists of two identical signal processing circuits 62 and 64 responsive to the output signals of the transient alarm filter circuits 42 and 52 respectively. The signal processing circuit 62 associated with the warning alarm level transient filter circuit 42 includes an AND/OR select gate U8A (commercial circuit 408513) and a flashing state flip-flop U7A (commercial circuit 74C73). Similarly signal processing circuit 64 associated with the shutdown alarm level transient filter circuit 52 consists of an AND/OR select gate U8B and a flashing state flip-flop U7B. A mute signal select gate U2C (commercial circuit 74C08) serves both signal processing circuits 62 and 64. Inasmuch as the operation of the signal processing circuits 62 and 64 are identical, it will be assumed, for the purpose of discussion that a level change from the transient alarm filter circuit 42 indicates a true alarm condition. This level change condition as transmitted through the inverter circuit U6A functions to set the flashing state flip-flop U7A which results in the gating of the flash clock signal FC from the time base circuit TC through the AND/OR select gate U8A to activate appropriate visual and audio alarm indications at both the FR monitor 10 and the remote panel RP. The flip-flop U7A also results in a gate output signal from the mute signal select gate U2C which controls an audible alarm indication at the remote panel RP. When the alarm condition is acknowledged by an operator by the manual actuation of the alarm acknowledge switch S2 the flip-flop circuit U7A is reset thus removing the flash clocks signals FC. This results in a steady ON alarm light condition being displayed on the RF monitor 10 and at the remote panel RP, and terminating the audible alarm. The steady ON lights are cleared when the alarm condition is removed. In the event the alarm condition is removed prior to the actuation of the acknowledge switch S2, the AND/OR select gate U8A remains enabled and the audible alarm and flashing alarm lights remain activated until the acknowledge switch S2 is actuated. At that time the audible and visual alarms are extinguished. The above description of an audible/visual alarm sequence is merely illustrative of numerous schemes which can be implemented to satisfy the particular system application.

We claim:

1. Apparatus for detecting arcing conditions in an electrical generator, comprising, first circuit means for monitoring the RF current present in the neutral grounding circuit of the generator and producing an RF level output indicative thereof, which first circuit means includes an RF frequency selector means for selecting a predetermined frequency component of the RF current present in the neutral grounding circuit of the generator, amplifier circuit means for amplifying the selected component of said RF current, and a peak detector circuit for supplying a peak RF level signal to said second circuit means corresponding to the peak level of the selected frequency component of the RF current present in the neutral grounding circuit of the generator, second circuit means for comparing the RF level output of said first circuit means to a predetermined alarm level and producing an alarm indication output in the event the RF level exceeds the predetermined alarm level, and third circuit means for developing an indication of generator arcing conditions if the duration of said alarm indication output exceeds a predetermined time period.

2. Apparatus as claimed in claim 1 wherein said RF frequency selector means consists of a crystal filter means.

3. Apparatus as claimed in claim 2 wherein said crystal filter means is a bandpass filter means having a center frequency of approximately one megahertz, a shape factor corresponding to a 4-pole Chebyshev response, and a 3 dB bandwidth of approximately 5 kilohertz ±10%.

4. Apparatus as claimed in claim 1 wherein said amplifier circuit means further includes out-of-band filtering means to further reduce the probability that the selected frequency component to said peak detector circuit is out of the frequency selected band of said RF frequency selector means.

5. Apparatus as claimed in claim 4 wherein said out-of-band filtering means consists of two, 2-pole filters.

6. Apparatus for detecting arcing conditions in an electrical generator, comprising, a current transformer operatively connected to the neutral grounding lead of an electrical generator and developing an output signal indicative of the RF current flowing in the neutral grounding lead, an RF receiver assembly operatively connected to said current transformer for receiving said RF current output signal, said RF receiver assembly including:

a crystal filter means for selecting a predetermined frequency component of said RF current signal, first and second amplifier means, said first amplifier means being connected between said current transformer and said crystal filter means to provide a first level of signal amplification and to match the input impedance of the crystal filter means, said second amplifier means being connected to the output of said crystal filter means to provide both further signal gain and out-of-band filtering, log amplifier circuit means connected to the output of said second amplifier means including multiple gain stages connected in a cascaded arrangement, and a temperature compensated scaling and offset amplifier developing an output signal corresponding to the sum of said gain stages, and a peak detector circuit means connected to the output of the log amplifier curcuit means for developing a peak level output indicative of the peak RF signal within the predetermined frequency component established by said crystal filter means, means for comparing the peak RF level output of the peak detector circuit means to at least one predetermined alarm level and producing an alarm indication output in the event the peak RF level output exceeds the predetermined alarm level, and means for developing and indication of generator arcing conditions if the duration of said alarm indication output exceeds a predetermined time period.

7. Apparatus as claimed in claim 6 wherein said crystal filter means is a band-pass filter means having an outer frequency of approximately one megahertz, a shape factor corresponding to a 4-pole Chebyshev response, and a 3 dB bandwidth of approximately 5 kilohertz ±10%.

8. Apparatus as claimed in claim 6 wherein each gain stage of said log amplifer circuit means includes a limiting amplifier connected to the next gain stage and a Cooke-Yarborough circuit, the outputs of the Cooke-Yarborough circuits being summed by the temperatures compensated scaling and offset amplifier.

9. Apparatus as claimed in claim 6 wherein said current transformer has a frequency response between approximately 30 hertz and 30 megahertz.

* * * * *